United States Patent
Chang et al.

(10) Patent No.: US 7,516,316 B2
(45) Date of Patent: Apr. 7, 2009

(54) METHOD FOR LOADING CONFIGURATION DATA ONTO A NON-VOLATILE MEMORY AND A DEVICE USING THE SAME

(75) Inventors: Chi-Tung Chang, Taipei (TW);
Hung-Chun Chen, Taipei (TW);
Ching-Wen Wang, Sijhih (TW)

(73) Assignee: Alcor Micro, Corp., Taipei (TW)

( * ) Notice: Subject to any disclaimer, the term of this patent is extended or adjusted under 35 U.S.C. 154(b) by 488 days.

(21) Appl. No.: 11/280,319

(22) Filed: Nov. 17, 2005

(65) Prior Publication Data

US 2007/0055854 A1 Mar. 8, 2007

(30) Foreign Application Priority Data

Sep. 6, 2005 (TW) .............................. 94130533 A

(51) Int. Cl.
*G06F 9/00* (2006.01)
(52) U.S. Cl. .......................................... 713/1; 711/100
(58) Field of Classification Search ...................... 713/1; 711/100
See application file for complete search history.

(56) References Cited

U.S. PATENT DOCUMENTS

| 6,981,136 B2 * | 12/2005 | Fuse et al. ..................... 713/2 |
| 7,162,568 B2 * | 1/2007 | Huang et al. ................ 711/102 |
| 2005/0160217 A1 * | 7/2005 | Gonzalez et al. ............... 711/6 |

* cited by examiner

*Primary Examiner*—Thomas Lee
*Assistant Examiner*—Albert Wang
(74) *Attorney, Agent, or Firm*—Rosenberg, Klein & Lee

(57) ABSTRACT

A method for loading configuration data onto a non-volatile memory and the device using the same is provided. A non-volatile memory block is preloaded with a certain compatible memory configuration data in advance when the memory device is being manufactured. The memory configuration data comprises plural parameters corresponding to the non-volatile memory. When readying the memory device, the preloaded configuration data is loaded onto a random-access memory thereof so as to save the space in a read-only memory used for storing the memory's identification and its specification. Additionally, means for loading the configuration data from the preload zone onto the random-access memory is introduced to update the firmware.

19 Claims, 8 Drawing Sheets

METHOD FOR LOADING CONFIGURATION DATA ONTO A NON-VOLATILE MEMORY AND A DEVICE USING THE SAME

BACKGROUND OF THE INVENTION

1. Field of the Invention

A method for loading configuration data onto a non-volatile memory and a device using the same is provided, and more In particular, a non-volatile memory with a pre-load zone onto which the configuration data is loaded during its manufacturing process, and the configuration data is automatically loaded onto a RAM as the device is powered on.

2. Description of Related Art

Conventional memory devices require that various specifications of different flash memory modules from various manufacturers be compatible, that is, that the memory device must include a plurality of memory types or their specifications. Thus the data for all types of flash memory are directly loaded onto the firmware of prior art devices, wherein the firmware having the data is a preferred implementation for overcoming the problems thereof.

For example, the configuration data of flash memory modules are loaded onto a read-only memory (ROM), which is part of the firmware. The manufacturing method of a semiconductor therefore, such as the steps of photo-masking or etching, includes all the required information, therefore a large memory size is needed and manufacturing the device is a time consuming process. If any configuration of the flash memory is changed by the manufacturer, the manufacturing process needs to be amended, updated or re-designed. Obviously this increases costs and slows the manufacturing process.

In consideration of the mentioned drawback of the conventional art, the variational part of the configuration data of the specific flash memory is stored onto a writable/erasable medium in the prior art, so that it's convenient to update or amend the program therein afterward.

Reference is made to FIG. 1 showing a schematic diagram of a typical flash memory device. The flash memory device comprises a flash memory portion 101 having a plurality of flash memory blocks 103, a random-access memory (RAM) 105 and a special function register (SFR) 107. The special function register 107 is an inner controller of a single chip and also a buffer used for the plural peripheral modules. A vector table 109 is disposed to select a memory address corresponding to an interrupt service routine (ISR) within the controller.

When the above-mentioned firmware is being updated or amended, a method and apparatus for dynamically modifying a stored program (U.S. Publication App. No. 2003/0005212) is provided. Reference is made to FIG. 2 showing a schematic diagram of a memory being updated dynamically. The memory is a writable and programmable flash memory 101, wherein the correction code is stored on at least one of a plurality of correction blocks 203 included in an erasable programmable memory and a program having instructions is stored on a program block 205. Furthermore, the flash memory correction initialization commands are stored on a command block 207, and a CPU rewrite code is stored on a CPU code block 209.

In the mentioned prior art, the CPU rewrite code stored on the CPU code block 209 will be saved on the random-access memory 211 firstly as the memory device is being amended or updated. In the meantime, a universal asynchronous receiver transmitter (UART) 213 used for transmitting or receiving flash memory portion 101 loads the codes from an external device into the flash memory device in the step of updating or amending.

Referring to U.S. Pat. No. 6,795,872, another updating means discloses maintaining at least partial functionality of a device as defined by a hardware configuration at a USB bus enumeration while the device memory is being programmed. As the device powers on, the state of the firmware thereto is configured as writable. Then a computer performs a linkage with the device via an interface, like a USB (Universal Serial Bus), thus a user can configure the setting thereof, furthermore, a driver or another means therefore can perform any modification via the interface. For the duration of the modification, a control program, which is loaded into a random-access memory (RAM), is executed in the device, after that, the computer transfers the required commands to perform the modification.

U.S. Publication App. No. 2005/0120343 discloses a method for loading a firmware program. Reference is made to FIG. 3, wherein a USB host controller 305 of a computer host 31 connects to a USB device 30 via a USB bus. The USB device 30 has a micro-processing unit (MPU) 304, an EEPROM 301, a memory 302 and a timer 303 that are coupled to the micro-processing unit 304. The USB device 30 downloads data or the updating program of the firmware via the micro-processing unit 304 of the computer host 31, wherein the EEPROM 301 stores up the application program, boot-up codes, and the memory 302 stores up some regular data.

In the mentioned prior arts, an external writable/erasable memory, such as the random-access memory (RAM), is used for modifying or updating the firmware of the device. However, some other possible modifying or updating methods are provided, for example, an additional flash memory block or a writable memory block manufactured on a read-only memory are the means for achieving the above-mentioned purpose. In particular, the present invention further provides a method for loading configuration data onto a non-volatile memory and a device using the same.

SUMMARY OF THE INVENTION

A method for loading configuration data onto a non-volatile memory and a device using the same is provided, wherein a preload zone in the non-volatile memory is allocated in advance. In the beginning, a tool program is used to load some memory parameters, such as memory identification, access timing, and the like, onto the preload zone. Then the data stored on the preload zone is loaded onto a RAM of the memory device as it powers up. Therefore, the method and the device thereof can be used to reduce used memory space of a ROM of the memory device and perform the step of updating the firmware.

The method for loading configuration data onto a non-volatile memory comprises a step of initializing a non-volatile memory in the memory device in the beginning, and a step of allocating a preload zone, and a step of loading the configuration data of the non-volatile memory onto the preload zone afterward, and then powering on the memory device, and a step of initializing the memory device, and a step of loading the configuration data of the non-volatile memory from the preload zone onto a random-access memory (RAM) of the memory device, and finally a step of verifying the type of memory of the non-volatile memory.

Furthermore, a non-volatile memory device incorporating the above method for loading configuration data onto a non-volatile memory comprises a non-volatile memory module, which is the non-volatile memory used for storing data, and a preload zone, which is a memory space allocated in the non-volatile memory module in advance, and is used for storing configuration data changed in response to the type of memory of the non-volatile memory, and a memory control unit coupled to the non-volatile memory module, which is an embedded micro-controller of the memory device, and a random-access memory (RAM) coupled with the memory control unit, which is a dynamic memory used for loading program code as the memory device operates a program, and a read-only memory module coupled with the memory control unit, which is a memory used for storing the unchanged data in response to the type of memory of the non-volatile memory. Whereby, the configuration data preloaded in the preload zone is loaded onto the RAM module as the memory device is powered on, the non-volatile memory device is used to overcome the drawback that the conventional manufacturing method used for ROMs needed be modified according to the changed type of memory of the non-volatile memory.

BRIEF DESCRIPTION OF DRAWINGS

The present invention will be readily understood by the following detailed description in conjunction accompanying drawings, in which.

DETAILED DESCRIPTION OF THE PREFERRED EMBODIMENTS

To understand the technology, means and functions adopted in the present invention further, reference is made to the following detailed description and attached drawings. The invention shall be readily understood deeply and concretely from the purpose, characteristics and specification. Nevertheless, the present invention is not limited to the attached drawings and embodiments in following description.

A conventional non-volatile memory device, such as a portable disk drive and a flash memory medium like SD/MS/CF/MMC, has a memory micro-controlling unit (MCU) used for booting up the memory device or accessing data, a random-access memory (RAM) for operating the process of booting or data buffering, and a read-only memory (ROM) for storing the specification of the memory, a manufacturer's identification, a basic input/output program, an application, or a booting program, etc.

For overcoming the deficiencies of the prior art, which means that the process is expensive, requires a large memory size, and the manufacturing method for the ROM must be modified because the type of the non-volatile memory is changed, the present invention provides a new method for loading configuration data onto the memory and the device thereof.

In particular, a preload zone having a specific memory address or a memory block is allocated on the non-volatile memory in advance. The preload zone has been stored the data varied in response to the various type of memory. For example, the configuration data recording the memory's characteristics comprises information having identification, specifications, access timing, controlling commands or new functions compatible with each memory. The above configuration data of the memory is loaded into the random-access memory from the preload zone as the non-volatile memory device is powered on. Whereby, the conventional skill of pre-saving the data onto the ROM or other similar methods is replaced with the above-mentioned means for loading the configuration data from the preload zone onto the non-volatile memory of the present invention.

Correlatively, the read-only memory (ROM) existing in the non-volatile memory device stores up the unchanged parts, such as industrial standards having the memory structure, protocols of communication interfaces (USB, IEEE) or the like, even if the memory's configuration is altered.

Once the memory device powers up, a loading means is introduced to load the configuration data from the preload zone to the RAM and incorporate the recorded data in the ROM, so as to activate the non-volatile memory device.

Figure 1:
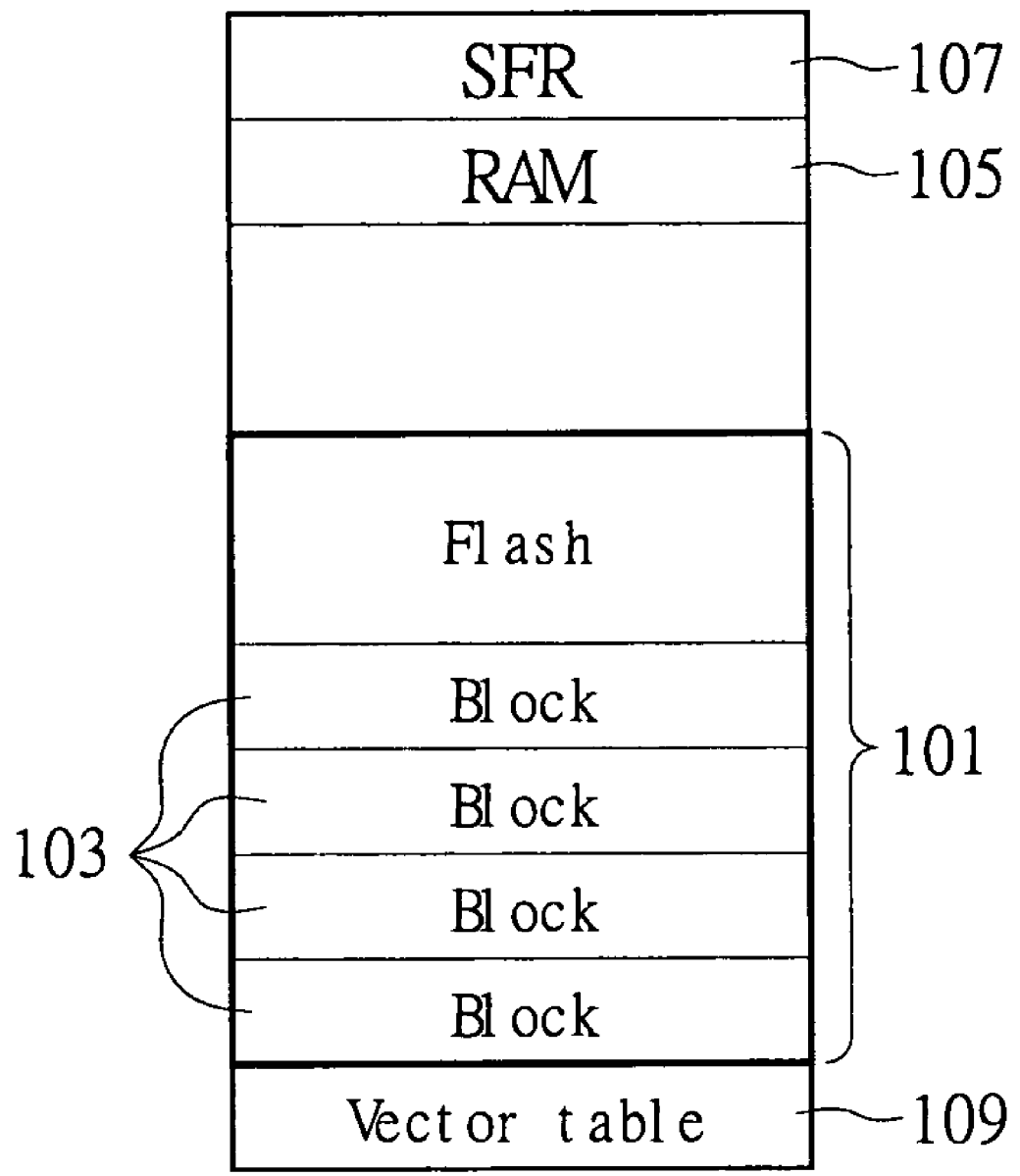
FIG. 1 is a schematic diagram of a flash memory device of the prior art.
Figure 2:
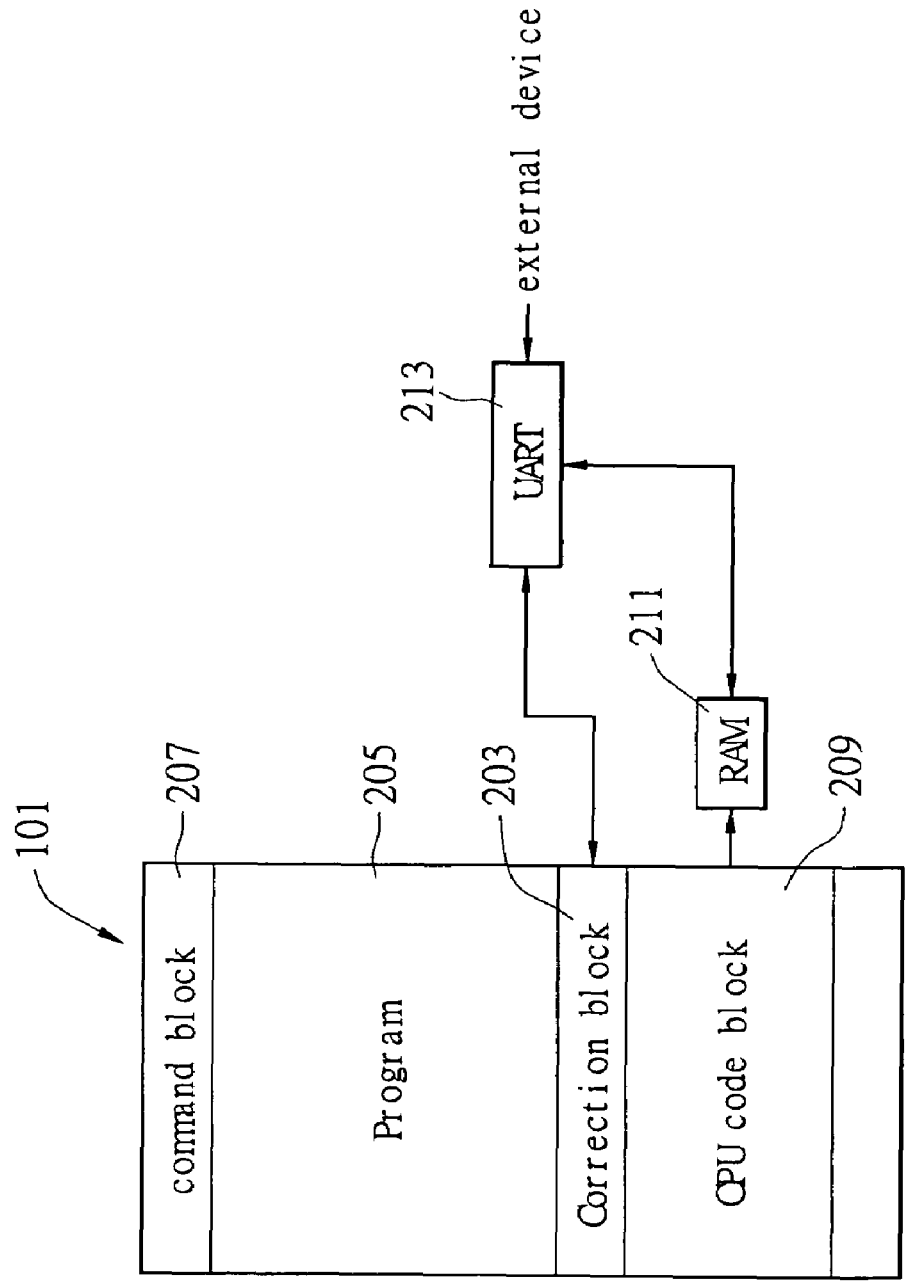
FIG. 2 is a schematic diagram showing the means for dynamically modifying the memory of the prior art.
Figure 3:
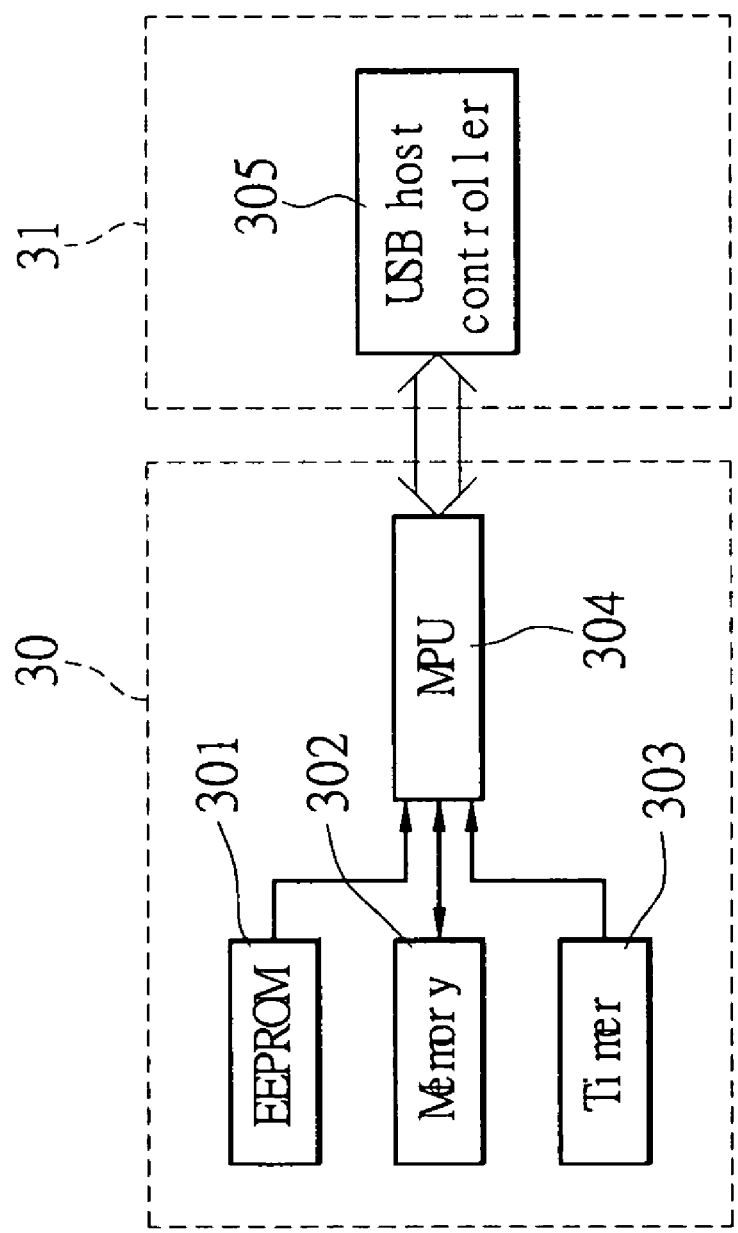
FIG. 3 is a schematic diagram showing a device for downloading the firmware thereto of the prior art.
Figure 4:
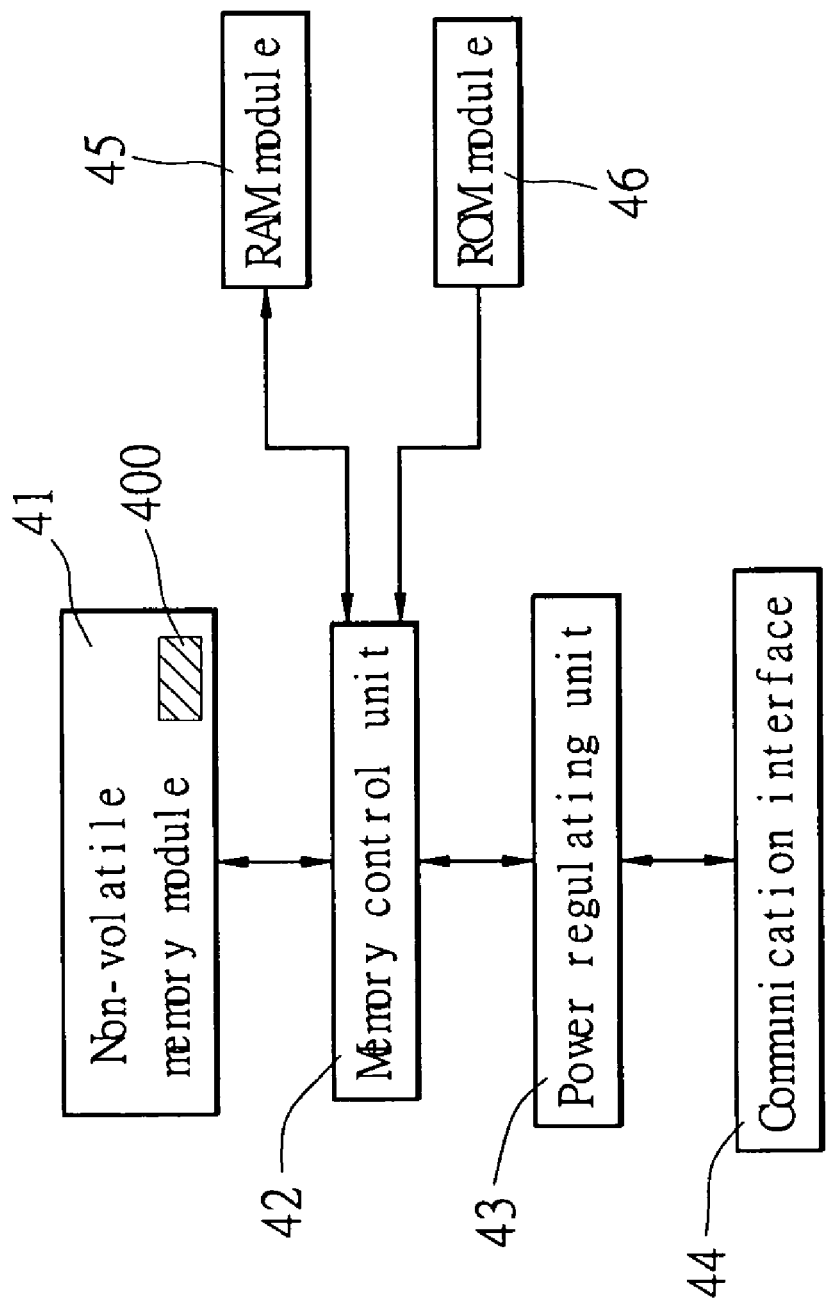
FIG. 4 shows a non-volatile memory device of the present invention.

Reference is made to FIG. 4 showing the preferred embodiment of the non-volatile memory device of the present invention. The memory device has a non-volatile memory module 41 for storing up data, and the module 41 can be a flash type of memory. A preload zone 400 shown in FIG. 4 is allocated in a pre-determined memory address or a memory block as the non-volatile memory is formatted or initialized. The preload zone 400 is a memory space that is pre-determined in the non-volatile memory module 41, wherein the memory space can be a memory block having sequential memory addresses or a memory block having non-sequential memory addresses being labeled.

The non-volatile memory module 41 couples to a memory controlling unit 42 of the memory device, wherein the memory control unit 42 is an embedded micro-controlling unit (MCU) of an embodiment of the present invention for the purposes of memory initialization, memory addressing, I/O controlling, power managing, data processing and the like. The memory control unit 42 further couples to a power regulating unit 43 by which the power transferred through the communication interface 44, such as USB or IEEE, can be managed. The communication interface 44 is utilized to transmit data to an external device and transfer the power supplied by the external device further.

The memory control unit 42 couples to a RAM module 45 and a ROM module 46 of the memory device, wherein the RAM module 45 is the dynamic memory for loading the program codes when the program is executed. That is, when the memory device powers up, the related codes required for the system are loaded into the RAM module 45. The RAM module 45 can be a buffer for accessing data, and electrically connects with the non-volatile memory module 41, the memory control unit 42 and the ROM module 46 via a bus.

Figure 5:
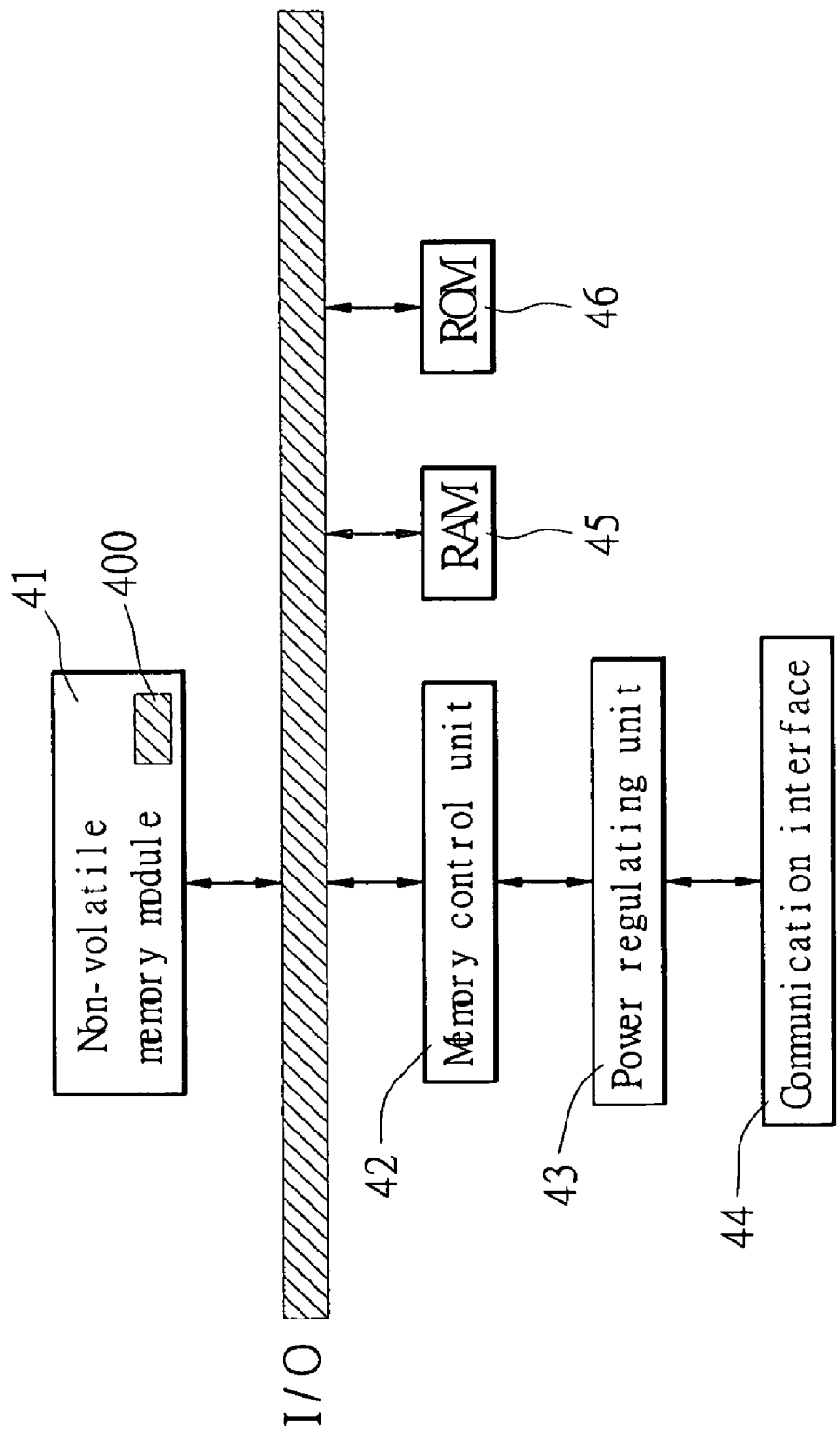
FIG. 5 shows a memory device of the present invention.

FIG. 5 shows the preferred embodiment of the memory device of the present invention. The above-mentioned modules or units employ the bus to couple with each other as shown in FIG. 4, which includes the non-volatile memory module 41, the memory control unit 42, the RAM module 45 and the ROM module 46. The memory control unit 42 further couples to the communication interface 44 via a power regulating unit 43, so as to electrically connect to the external device and process the steps of data transferring or power retrieving.

Accordingly, the preload zone 400 is the memory block or the address-labeled memory space of the non-volatile memory module 41. The preload zone 400 stores up the configuration data, which can be modified in response to any change of the type of memory, so that the approach is to reduce the memory space of the ROM module 46 used to include various configuration data compatible with all types of memory.

In particular, the preload zone 400 provided by the present invention can only store up a set of data relative to a specific memory, and it doesn't need to store every data for each type of memory. After that, the required configuration data only for the specific non-volatile memory is loaded as the memory device powers up. If the only required configuration data is stored onto the preload zone 400, the step of examining the type of memory can be reduced afterward, so as to enhance the operating performance of the memory device.

Figure 6:
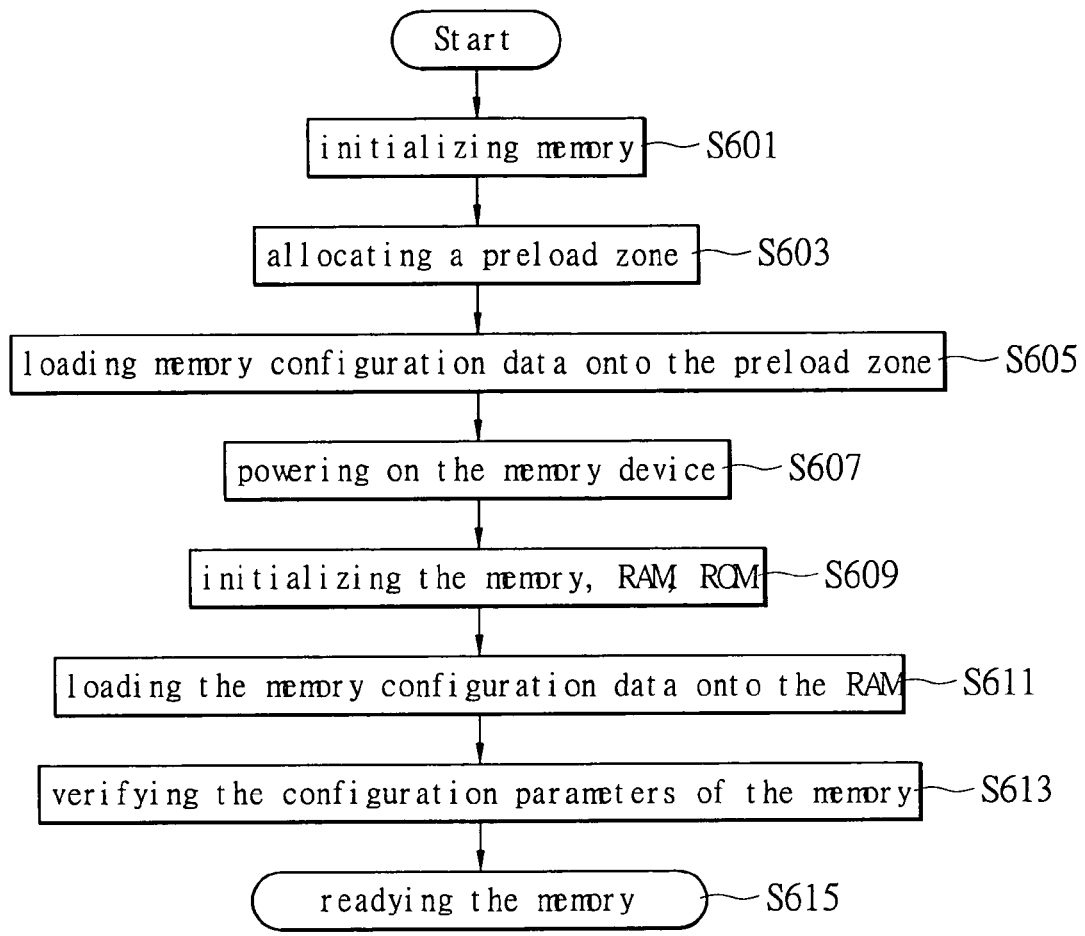
FIG. 6 shows a flowchart of the method for loading configuration data of the non-volatile memory of the present invention.

Reference is made to FIG. 6 showing the preferred embodiment of a flowchart for loading the configuration data of the non-volatile memory of the present invention. In the beginning, the non-volatile memory device is prepared for initialization (step S601), wherein the non-volatile memory device is a flash memory of the preferred embodiment. In particular, the means for initializing is to format a memory block of the non-volatile memory. For the duration of the initialization, a preload zone is allocated on the memory block (step S603), and the preload zone is the memory block having sequential memory addresses or non-sequential memory addresses, which are labeled specifically. Next, a tool program is utilized to load the memory configuration data of the non-volatile memory onto the preload zone (step S605). The preferred embodiment of the tool program can be a mass-production program (MP program) used in preparation of the memory device, whereby the mass-production program accomplishes the above-mentioned steps of initializing the memory, allocating the preload zone and loading the configuration data.

After the step of loading the configuration data in the memory device, the memory device is powered on (step S607). The preferred embodiment of the means for powering on the memory device is that the memory device electrically connects to an external device, such as a computer system, via the communication interface. In particular, the memory device is powered on because of the characteristics of the communication interface, so the external device can supply the memory device with electric power.

Next, the memory control unit initializes the memory device, that is, it initializes each module or unit, such as the non-volatile memory, RAM, ROM or the like in the memory device (step S609). After that, the means for loading implements the step of updating the firmware or the step of loading configuration data thereof, that is, the configuration data or parameters relative to the type of memory, is loaded from the preload zone onto the RAM module (step S611). After verifying the configuration data (parameters) of the memory (step S613), the memory device is ready.

Figure 7:
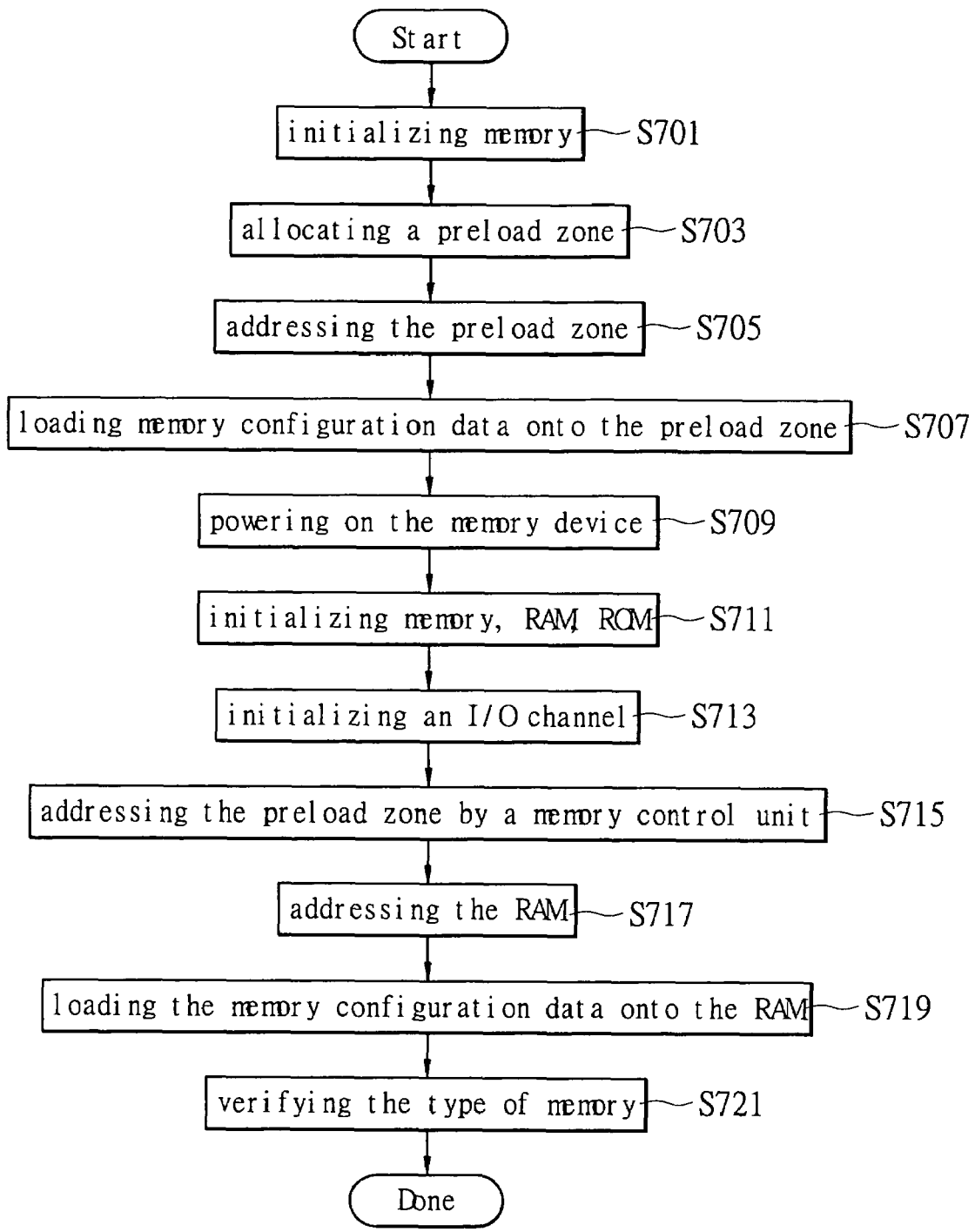
FIG. 7 shows a flowchart of the embodiment showing the method for loading configuration data of the non-volatile memory of the present invention.

The preferred embodiment of the present invention referring is shown in FIG. 7, which shows a flowchart of the steps of loading the configuration data. In the step of preparing the memory device, the non-volatile memory therein is initialized. The step of initializing starts from the step of soldering a controlling circuit board with the memory device. During initialization, the tool program is firstly executed, then the memory control unit reads out the identification (ID) of the memory type from the ROM of the memory device. Furthermore, the information which includes a manufacturing code, a device ID, block size, memory volume, multiple-level cell (MLC), single-level cell (SLC) or the like from the identification is obtained. After that, the tool program initializes the memory block into a specific format according to the information in response to the type of memory (step S701).

In this embedment, a preload zone is allocated in the memory block after the memory device is prepared (step S703), wherein the preload zone can be the memory block having the sequential memory addresses or non-sequential memory addresses. After that, the preload zone is addressed in the memory by functioning the tool program (step S705), wherein the addresses are labeled. Next, the configuration data for the specific non-volatile memory is loaded onto the preload zone (step S707). For example, the steps of initializing memory, allocating the preload zone, and loading the configuration data are processed by the tool program.

Next, a step of verifying the memory device is processed. Firstly, the memory device is powered on (step S709). For example, while the memory device electrically connects to an external device, the external device can supply the memory device with electric power. After that, the plurality of modules or units, such as the memory block, RAM, ROM or the like, are initialized (step S711), and so are the I/O channels for the modules or the units (step S713). In the meantime, the memory control unit addresses a specific memory block of the non-volatile memory module for the preload zone (step S715). Likewise, the memory control unit addresses a RAM module to develop a specific memory block used for loading the configuration data (step S717).

Next, the configuration data stored to the preload zone relative to the non-volatile memory is loaded onto the RAM module (step S719). After that, a verifying step verifies whether the loaded configuration data corresponds to the type of memory thereof (step S721). Finally, the changeable configuration data stored onto the RAM module and the unchangeable data stored onto the ROM module are used to ready the memory device.

Since the above-mentioned method and the device using the same of the present invention employs the preload zone for storing up the configuration data in response to the various type of memory, the memory device can be designed flexibly and duly cooperated with specific types of memory and specifications, so as to update or amend the configuration therein. Therefore, the configuration data stored onto the preload zone is loaded onto the RAM of the memory device as it powers up.

Figure 8:
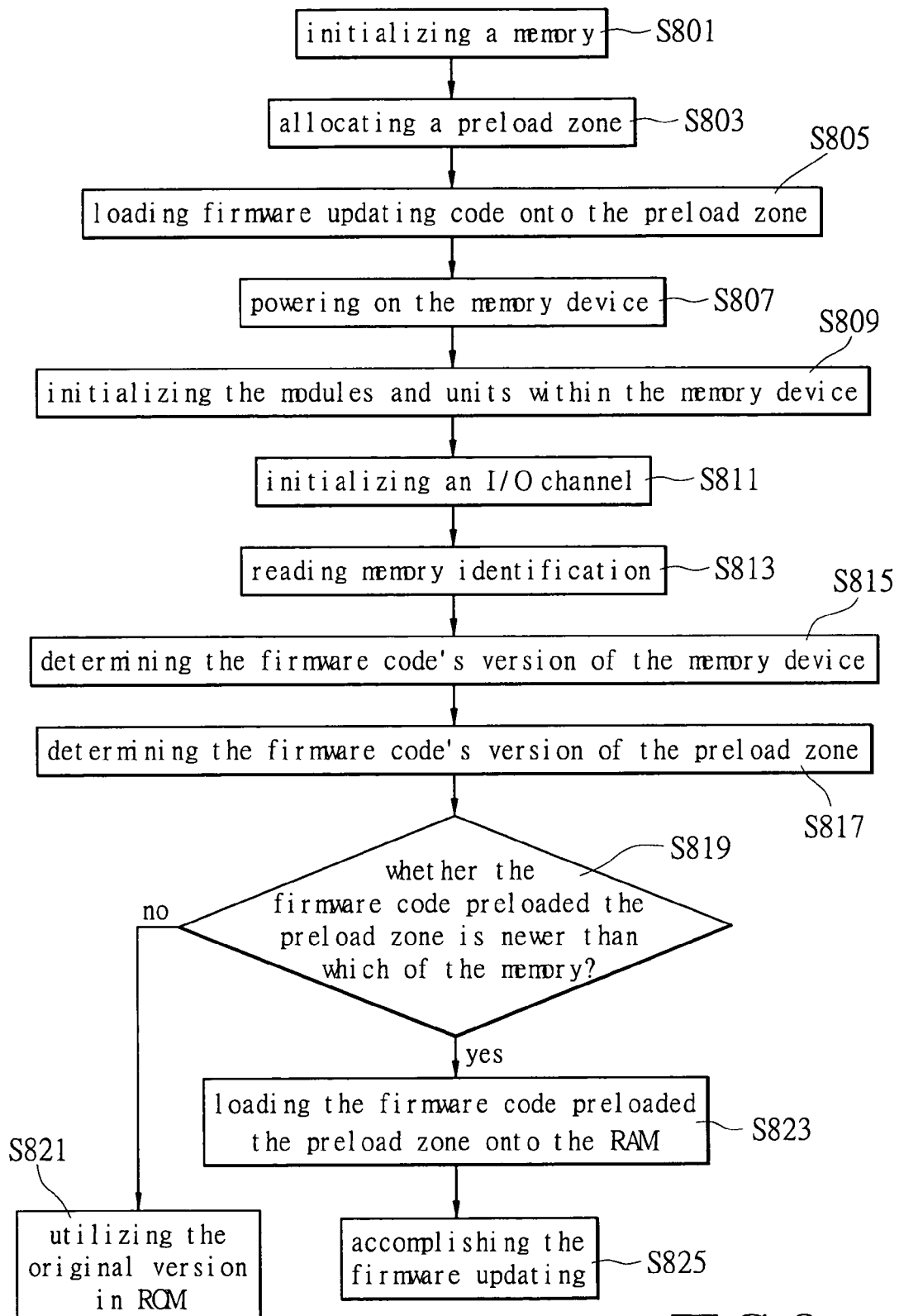
FIG. 8 shows a flowchart of the embodiment showing an updating method for a firmware using the method loading configuration data of the non-volatile memory of the present invention.

Reference is made to FIG. 8 showing a flowchart of the preferred embodiment in the present invention. A preload zone is utilized to store the firmware codes of updating means in this embodiment. In preparation for the memory device, the step of initializing is processed, for example, the memory is formatted after identifying the type of memory (step S801). The preload zone, which is the memory block having the sequential memory addresses or non-sequential memory addresses, is allocated (step S803). After that, the firmware codes are loaded onto the preload zone, thereby loading the updating configuration data of the firmware onto the preload zone (step S805). This is followed by a testing step.

The memory device is powered on (step S807). For example, the memory device can be powered on since it electrically connects to a computer host, or another power source can supply the memory device with electric power. After that, the modules and units within the memory device are initialized (step S809). Furthermore, an I/O channel among the modules is initialized (step S811). Next, a memory control unit reads out the memory identification from the RAM having the updating configuration data and loads the relative parameters afterward (step S813). Next, a step of determining the version of the firmware code of the memory device (step S815) and a step of determining the version of the firmware code of the preload zone are performed sequentially (step S817).

Next, the version of the firmware is determined to determine whether the firmware code in the preload zone is newer than that of the memory, or another equivalent method is used to determine which device has a newer version of the firmware (step S819). If the firmware's version of the data stored onto the preload zone is older than the original version, the original one is used (step S821). In particular, the original version can be stored on the ROM or another specific memory thereof.

If the firmware's version of the data stored onto the preload zone is newer, the updating configuration data of the firmware is loaded onto the RAM of the memory device (step S823) to update the firmware (step S825).

The many features and advantages of the present invention are apparent from the written description above and it is intended by the appended claims to cover all. Furthermore, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for loading configuration data onto a non-volatile memory to prepare a memory device, comprising the following steps in the manufacturing process:
   initializing a non-volatile memory, a random-access memory (RAM) module, and a read-only memory (ROM) module in the memory device;
   allocating a preload zone, the preload zone being a predetermined memory block or address labeled memory space of the non-volatile memory;
   addressing the preload zone of the non-volatile memory;
   addressing the RAM module of the memory device;
   addressing the ROM module of the memory device;
   loading configuration data of the non-volatile memory onto the preload zone;
the method further comprising the following steps after connection to an external device, for preparation to use and for verification:
   powering on the memory device;
   initializing the memory device;
   automatically loading the configuration data of the non-volatile memory from the preload zone onto the random-access memory (RAM) module and then incorporating the preload zone configuration data with unchangeable configuration data stored on the read-only memory (ROM) module of the memory device in order to activate the non-volatile memory device, a combination of the preload zone configuration data and the unchangeable configuration data from the read-only memory (ROM) being the result loaded onto the random-access memory; and
   verifying the type of non-volatile memory.

2. The method as recited in claim 1, wherein the non-volatile memory is initialized by means of formatting.

3. The method as recited in claim 1, wherein the step of initializing the non-volatile memory has a step for reading an identification of the non-volatile memory and a further step of formatting the non-volatile memory in response to the identification.

4. The method as recited in claim 1, wherein the step of loading the configuration data of the non-volatile memory is implemented by means of a tool program.

5. The method as recited in claim 4, wherein the tool program is a mass-production program used for preparing the memory device.

6. The method as recited in claim 1, wherein the memory device is powered on once the memory device connects with a computer system.

7. A non-volatile memory device incorporating the method for loading configuration data onto a non-volatile memory as recited in claim 1, comprising:
   a non-volatile memory module used for storing data;
   a preload zone, the preload zone being a predetermined memory space allocated in the non-volatile memory module, the preload zone being used for storing configuration data changed in response to the type of non-volatile memory;
   a memory control unit coupled to the non-volatile memory module, the memory control unit being an embedded micro-controller of the memory device;
   a random-access memory (RAM) coupled with the memory control unit is used for storing program code, the memory device implementing the program code; and
   a read-only memory module coupled with the memory control unit and used for storing the unchanged configuration data of the non-volatile memory type;
   whereby, the configuration data preloaded in the preload zone is automatically loaded onto the RAM module as the memory device is powered on, the non-volatile memory device thereby eliminating the need for ROM to be modified according to a change of the type of non-volatile memory.

8. The device as recited in claim 7, wherein the memory device further comprising:
   a power regulator coupled to the memory control unit; and
   a communication interface, which is an interface used for transferring data with an external device, power being supplied by the external device.

9. The device as recited in claim 7, wherein the non-volatile memory is a flash memory.

10. The device as recited in claim 7, wherein the preload zone is a memory block with a plurality of continuous memory addresses in series.

11. The device as recited in claim 7, wherein the preload zone is a memory space with a series of un-continuous labeled memory addresses.

12. The device as recited in claim 7, wherein the RAM is a buffer memory used for accessing data of the memory device.

13. The device as recited in claim 7, wherein the data preloaded in the preload zone comprises identification information of the non-volatile memory and its specification.

14. The device as recited in claim 7, wherein the data preloaded in the preload zone comprises an access timing period for the non-volatile memory.

15. An updating method for firmware by means of loading configuration data onto a non-volatile memory, the method comprising the following steps in the manufacturing process:
   initializing the non-volatile memory, a random-access memory (RAM) module, and a read-only memory (ROM) module of a memory device;
   allocating a preload zone in the non-volatile memory;
   loading firmware code for updating the configuration data of the firmware version of the memory device onto the preload zone;

the method further comprising the following steps after connection to an external device, for preparation to use and for verification:

powering on the memory device;

initializing the memory device;

reading memory identification information of the random-access memory (RAM) module in the memory device;

determining a default value of the code of the firmware version of the memory device;

determining a value of the code of the firmware version preloaded onto the preload zone of the non-volatile memory;

comparing the value of the code of the firmware version preloaded onto the preload zone with the default value of the code of the firmware version of the memory device; and loading the value of the preloaded code for updating the firmware version from the preload zone onto the RAM module if the default value of the code of the firmware version of the memory device is not equal to the value of the code of the firmware version preloaded onto the preload zone thereby updating the firmware version, and maintaining the original firmware version if the default value of the code of the firmware version of the memory device is equal to the value of the code of the firmware version preloaded onto the preload zone.

16. The method as recited in claim 15, wherein the non-volatile memory is initialized by means of formatting.

17. The method as recited in claim 15, wherein the step of initializing the non-volatile memory has a step for reading an identification of the non-volatile memory and a further step for formatting the non-volatile memory in response to the identification.

18. The method as recited in claim 15, wherein the step of loading the configuration data of the non-volatile memory is implemented by means of a tool program.

19. The method as recited in claim 18, wherein the tool program is a mass-production program used for preparing the memory device.

* * * * *